(12) United States Patent
Roman et al.

(10) Patent No.: US 6,826,035 B2
(45) Date of Patent: Nov. 30, 2004

(54) SILICON CONTROLLED RECTIFIER POWER CONTROLLER

(75) Inventors: Alfred R. Roman, Hendersonville, TN (US); Michael Hardy, Nashville, TN (US); Wayne Estes, Nashville, TN (US); Daniel White, Franklin, TN (US); Jerry Black, Murfreesboro, TN (US)

(73) Assignee: Chromalox, Inc., Pittsburgh, PA (US)

( * ) Notice: Subject to any disclaimer, the term of this patent is extended or adjusted under 35 U.S.C. 154(b) by 46 days.

(21) Appl. No.: 10/255,742

(22) Filed: Sep. 26, 2002

(65) Prior Publication Data

US 2004/0061992 A1 Apr. 1, 2004

(51) Int. Cl.[7] ................................................. H02B 1/26
(52) U.S. Cl. ...................... 361/622; 361/624; 361/631
(58) Field of Search ................................ 361/601, 624, 361/627, 637, 647, 648

(56) References Cited

U.S. PATENT DOCUMENTS

| | | |
|---|---|---|
| 3,811,958 A | 5/1974 | Maurer |
| 5,101,320 A | 3/1992 | Bhargava et al. |
| 5,170,336 A | 12/1992 | Getter et al. |
| 5,670,936 A | 9/1997 | Estes et al. |
| 5,680,294 A | 10/1997 | Stora et al. |
| 5,945,746 A | 8/1999 | Tracewell et al. |
| 6,046,921 A | 4/2000 | Tracewell et al. |
| 6,418,015 B1 | 7/2002 | Kociecki |
| 6,493,227 B2 | 12/2002 | Nielsen et al. |
| 6,515,858 B2 | 2/2003 | Rodriguez et al. |

*Primary Examiner*—Boris Chervinsky
(74) *Attorney, Agent, or Firm*—Kirkpatrick & Lockhart LLP

(57) ABSTRACT

A power controller generally includes a first switching device and a first bus bar mounted to the first switching device such that wiring may enter and exit the power controller. The first bus bar may have a face plate that extends at least partially above opposed side plates of the power controller and a mounting plate in electrical contact with the first switching device.

A power controller assembly generally includes a power controller having one or more bus bars and a cover having a top surface, opposed end surfaces, and opposed side surfaces for attaching to and enclosing the power controller. The opposed end surfaces may have one or more windows through which wiring may pass and connect to one or more of the bus bars of the power controller.

30 Claims, 12 Drawing Sheets

SILICON CONTROLLED RECTIFIER POWER CONTROLLER

TECHNICAL FIELD

This invention relates generally to a power controller for industrial applications and, more particularly, to a silicon controlled rectifier (SCR) power controller.

BACKGROUND

Power controllers are used in industrial applications to regulate power supplied to machinery, manufacturing equipment, and support systems such as heating and air conditioning systems, for example. In general, a power controller provides the interface between an electrical utility (e.g., user owned power generating facility or other supplier) and the electrical distribution network being served by the power supplied by the electrical utility. The power controller typically functions to supply power to using equipment under normal operating conditions, as well as to interrupt the supply of power in the event of overloads or other extraordinary circumstances, to prevent damage to the network and the equipment connected to the network.

In many industrial applications, power controllers require large, expensive installations involving numerous switches, sensors, and indicators for automatically distributing power through the electrical distribution network. Furthermore, if there is a possible malfunction with the power controller, it is important to be able to shut down the power controller in a controlled manner to prevent damage to the using equipment.

Most large electrical resistance heaters utilize a three-phase circuit in which each circuit is individually fused. For a particular installation, a power controller may handle three-phase voltages of between 208Vac to 600Vac, with currents ranging from 50A to 2500A. In such applications, a silicon controlled rectifier (SCR) type power controller may be used to regulate the amount of electricity supplied to the resistive load of a heater. For example, the power controller may employ SCRs gated on to allow current flow in a particular direction. Once gated into conduction, each SCR will continue conducting until current flow in the desired direction stops. For alternating current (AC) power distribution networks, each SCR is gated into conduction for each half-cycle of the AC input wave form during which current flows to a particular phase.

The output of a SCR type power controller is often connected to a power distribution unit and to a number of three-phase fuse blocks. For example, the output may be wired to six or eight of such fuse blocks. In addition, the power controller also may include a firing unit or firing package having outputs connected to respective gate inputs of each SCR. In such cases, control or gate inputs for the SCRs are supplied as inputs to the circuitry within the firing package, which in turn produces output signals for gating the SCRs into conduction at the proper times.

Every component of a power controller consumes valuable panel space and necessitates additional wiring to make electrical connections between components. Because each electrical connection represents a potential problem and increases the cost of a unit by requiring additional labor and materials, minimizing the number of connections is a continuous goal.

To date, power controllers have not been designed so as to minimize connections and reduce initial cost. For example, existing power controllers provide very limited access to components and only few options for running the power wiring. In particular, such power controllers typically include only a single opening in a side of the unit for running wiring in and out of the same end or at most two openings in opposed sides for running wiring in one end and out of the other end. Consequently, it is often necessary to bend power wiring within and/or around the power controller to accommodate various designs. In large power controllers, several square feet of space may be required for bending the power wiring so that proper electrical connections can be made. The space and bending radius of power wiring can easily exceed the footprint of the power controller, resulting in a much larger unit than would otherwise be necessary.

Moreover, in power controllers that are closed or "touch safe," wiring becomes even more complicated. Power controllers that are "touch safe" generally include a door, hinged top, or other cover for shielding components that become hot to the touch during use. Such protective measures further limit access to components and the ways in which the power wiring can be routed.

Accordingly, there exists the need for a compact, versatile, and "touch safe" power controller having a cost-effective design that accommodates multiple electrical connections for various power applications.

Furthermore, SCR power controllers are not perfect conductors and exhibit some voltage drop across the SCRs. When current is flowing through the SCRs, the voltage drop generates heat. Heat must be removed from the SCRs so that a safe operating temperature is not exceeded causing failure of the controller. Some manufacturers have provided a thermostat mounted on a heat sink to shut down the SCR power controller if temperature approaches the point where the SCR may be damaged. There are two problems with this approach. The first is that thermostats have proved very inaccurate, and the other is that shutting down production with no warning can prove very costly in many industrial processes.

Accordingly, there exists the need for a power controller having an improved mechanical design and self temperature monitoring capabilities.

SUMMARY

In one general aspect, a power controller includes a first switching device and a first bus bar pair (an input bus bar and an output bus bar) mounted to the first switching device such that wiring may enter and exit the power controller. The first bus bar pair may have a face plate extending at least partially above opposed side plates of the power controller and a mounting plate in electrical contact with the first switching device.

Implementations may include one or more of the following features. For example, the wiring may enter and exit either end of the power controller in a direction substantially parallel to the opposed side plates. The wiring may be power wiring and/or load wiring.

The power controller may be configured to provide power distribution directly from the first output bus bar. The first output bus bar may be constructed of a plated copper material, such as tin-plated copper. The face plate of the first output bus bar may include a plurality of holes for accommodating connectors of different sizes, ranging from #8 AWG to 500 MCM. One or more lugs such as, for example, NEMA standard two hole copper crimp lugs, may be mounted to the first bus bar. The first bus bar may be electrically connected to one or more load circuits.

The power controller may be configured to supply at least one of single-phase power or three-phase power to using equipment. The power controller may include a firing package for controlling the first switching device. The firing package may include one or more plug and play cards, such as for example, a plug and play card for providing proportional control and/or providing shorted SCR detection. The firing package may include a jumper module for selecting between single-cycle control and three-cycle control. The firing package also may include a trigger board mounted on the switching device and containing the line voltage for triggering the first switching device. The trigger board may be configured for use with different sizes of switching devices by way of break-off tabs.

The power controller may be structured and arranged in a single-phase configuration, a three-phase two-leg configuration, and/or a three-phase three-leg configuration. The power controller may include a second bus bar, a third bus bar, and/or a fourth bus bar. The bus bars may be mounted such that wiring may enter and exit the power controller from either direction. The bus bars may each have a face plate extending at least partially above the opposed side plates of the power controller. The power controller may be configured to provide power distribution directly from the first bus bar, the second bus bar or the third bus bar. An insulator held in place by the bus bars and the switching device may be provided between bus bars.

In another general aspect, a power controller assembly includes a power controller having one or more bus bars and a removable cover having a top surface, opposed end surfaces, and opposed side surfaces for attaching to and enclosing the power controller. The opposed end surfaces may have one or more windows through which wiring may pass and connect to one or more of the bus bars of the power controller.

Implementations may include one or more of the following features. For example, the windows of the cover may be sealed with an insulator, such as a gasket material (e.g., styrene butadiene rubber). The gasket material may include slits through which wiring (e.g. power wiring, load wiring) may pass. The slits that are not used to pass wiring may be held together by tape. The insulator also may include an adhesive for adhering to the end surface of the cover.

Other features and advantages will be apparent from the following description, including the drawings, and from the claims.

DETAILED DESCRIPTION

Figure 1:
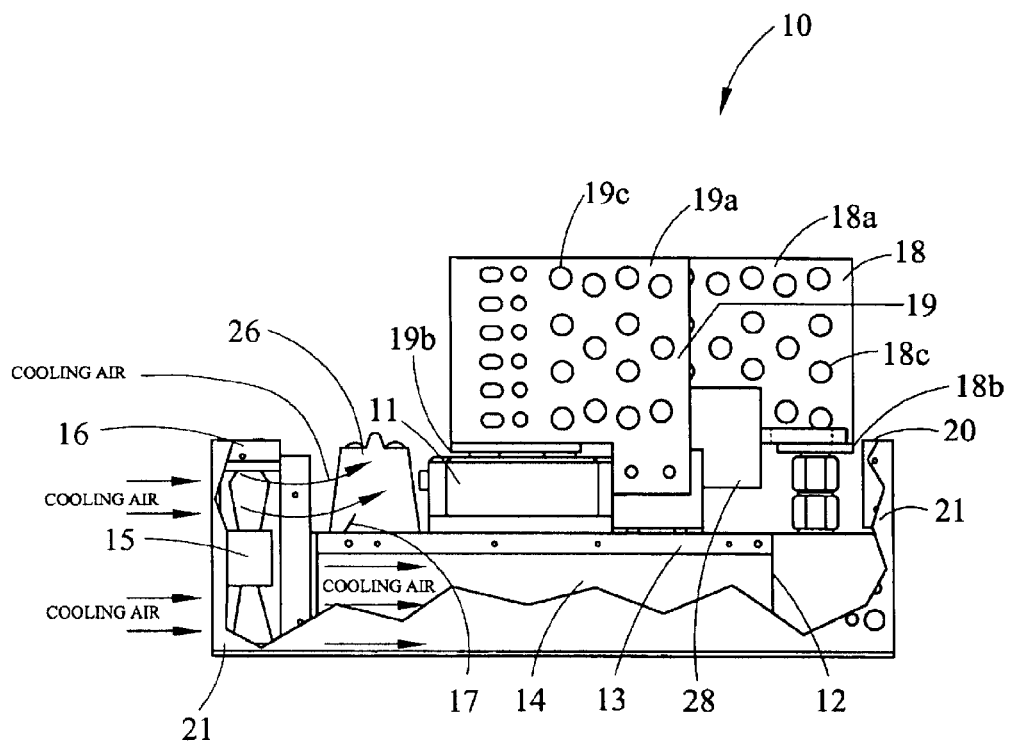
FIG. 1 illustrates aspects of one embodiment of a power controller according to the present invention.

Referring to FIG. 1, one embodiment of a power controller 10 is illustrated. In general, the power controller 10 is designed to provide convenience in installation and wiring by eliminating the need for separate power distribution blocks and by reducing labor and the required amounts of power wiring and connections. The power controller 10 also is designed to provide super operating performance through improved heat dissipation and an enhanced temperature warning and shutdown system.

In some implementations, the power controller 10 may be utilized in industrial power applications in which high-voltage, high-amperage single or three-phase power is regulated and supplied (e.g., 120 to 575 VAC at 100 to 1200 A). For example, the power controller 10 may provide an interface between a power generating facility and electrical equipment. The power generating facility may include a user-owned power generator or other power source for supplying power (e.g., poly-phase power) to the electrical equipment. The electrical equipment may include industrial machinery (e.g., power generation equipment, automotive finishing systems), manufacturing equipment (e.g., thin film manufacturing equipment, glass manufacturing equipment), and/or support systems such as heating systems (e.g., IR heating equipment, portable spot-heating equipment, ovens, kilns, environmental chambers, furnaces) and cooling systems (e.g., air conditioning systems, refrigeration systems).

To regulate power, for example, by muting each separate phase of poly-phase power, a power controller typically must include some type of switching mechanism. As shown in FIG. 1, the power controller 10 includes one or more silicon controlled rectifier (SCR) switching devices 11 for regulating power. While other solid-state devices may be utilized, SCR devices 11 are preferable due to their fast cycle times and ability to modulate small amounts of power to a load allowing close temperature control.

The power controller 10 may be configured to operate in single-phase and/or three-phase applications. For some single-phase applications, the power controller 10 may include a SCR switching device 11 having one pair of SCRs connected in inverse parallel to control the power output through a single current path or leg. For some three-phase applications, the power controller 10 may include two SCR switching devices 11 to control the power output through two legs of a three-wire load, i.e., a three-phase two-leg application. For other three-phase applications, the power controller may include three SCR switching devices 11 to control the power output through all three legs of a three-wire load or three legs of a four-wire load, i.e., a three-phase three-leg application. Examples of three-wire load configurations include a delta load and an ungrounded WYE load. An example of a four-wire load configuration is a WYE load having a center point connected to ground.

The power controller 10 may be implemented to control each SCR switching device 11 in one or more modes. In most implementations, the power controller 10 may utilize zero crossover control so that the SCRs gate only when the voltage across the SCR is zero. Examples of zero crossover control include On/Off firing, time proportional firing, and demand oriented transfer (DOT) firing. In On/Off firing, the SCR is triggered and power is supplied to the load whenever an input signal is present. In time proportional firing, the SCR is triggered when the voltage of the SCR goes positive. Proportioning the time that the SCRs are on verses the time they are off controls power to the load. DOT firing is similar to time proportional firing with the notable exception that the time base is not fixed. Reducing the time base to the minimum time base required to give the desired percentage output provides improved controllability. Accordingly, DOT firing is advantageous for applications where consistent heater and/or process control is critical.

In some implementations, the power controller 10 may utilize a non-zero crossover control such as phase angle firing. In phase angle firing, the amount of power to the load is controlled by turning on the SCRs at different points in the AC cycle. The power controller 10 may include current limiting features for maintaining a safe current level and soft starting features for slowly bringing the output voltage up to steady state upon power up.

In general, the power controller 10 may include a firing package for controlling the SCR switching devices 11 and/or other functions described herein. For example, the firing package (not shown) may include outputs connected to the respective gate input of each SCR switching device 11. Control or gate inputs for each SCR switching device 11 may be supplied as inputs to the circuitry within the firing package, which, in turn, produces gating signals supplied as inputs to the SCR switching devices 11 to gate the SCRs into conduction at the proper times.

In one embodiment, the firing package of the power controller 10 may includes a "trigger" board (not shown) mounted on each of the SCR switching devices 11. The trigger board may contain the line voltage (e.g., 480 VAC, 575 VAC, etc.) used for firing the SCR device 11. Accordingly, the line voltage may be kept under the cover of a touch safe unit. The trigger board also may be provided with break-off tabs for allowing the trigger board to be sized for different sizes of SCR switching devices 11. In one implementation, the break-off tabs allow the trigger board to be sized and mounted to any one of four different sizes of SCR switching devices 11.

In one embodiment, the firing package may include a control board that allows selection of various control options. For example, the control board may allow the option of selecting an operating mode, such as proportional control and/or shorted SCR detection. In some implementations, a "plug and play" card incorporated with the power control board may be used to implement these features. Additionally, the control board may allow selection of single-cycle or three-cycle control. In some implementations, a jumper module may be used to implement this feature. For example, the jumper module may be used to convert a three-phase, three-leg shorted SCR detection board to either a three-phase, two-leg, or a single-phase shorted SCR detection board.

When conducting current, a voltage drop may be developed across the SCR device 11. This voltage drop generates heat (wattage equals amperage multiplied voltage drop) that must be dissipated to avoid damage to the components of the power controller. In the embodiment of FIG. 1, the power controller is structured and arranged to provide improved heat dissipation. As shown, the power controller 10 includes a heat sink 12, upon which the SCR device 11 is mounted. The heat sink 12 includes a base 13 and a plurality of spaceport fins 14, only one of which is shown here, for distributing heat. The heat sink 12 may be constructed of stainless steel or any other suitable material.

The power controller 10 also includes a fan 15 installed at one end for drawing cooling air into the power controller 10. In some implementations, the power controller 10 may include a step-down transformer (not shown) mounted on or above the heat sink 12 and/or within the confines of a "touch safe" area. The step-down transformer may supply voltage to the fan 15 (e.g., 120 or 240 VAC) and low voltage to the main board of a power supply, while drawing power from a voltage line.

The fan 15 may be housed within a fan bracket 16. The mounting of the fan 15 within the fan bracket 16, however, may limit the direction of the airflow provided by the fan 15. In order to direct the cooling air to where it is most needed, the power controller includes an air guide 17 mounted to the base 13 of the heat sink 12. The air guide 17 completes a plenum chamber for forcing cooling air toward the heat sink 12. Namely, the sides of the fan bracket 16 and the air guide 17 may form a plenum chamber for the air from the fan 15. The percentage of cooling air directed from the fan 15 to the fins 14 of the heat sink 12 can be increased or decreased by bending the portion of the air guide 17 that forms the plenum chamber either up or down. As shown in the embodiment of FIG. 1, the air guide is bent at a 60° angle such that approximately 65% of the cooling air is forced through the heat sink fins 14 and the remaining cooling air is directed on top of the heat sink 12.

As indicated by the direction arrows, the air guide 17 divides the cooling air to force air over the base 13 of the heat sink 12 for cooling other components of the power controller 10. The use of the air guide 17 in conjunction with the fan 15 may cool critical parts on or above the heat sink 12, for example, the SCR switching device 11, the bus bars 18,19 and connectors mounted to the SCR switching device 11, and/or any other components mounted on or above the heat sink 12. While other functions of the bus bars 18,19 will be described in greater detail below, the bus bars 18,19 also function to dissipate heat within the power controller 10. In particular, the bus bar 19 is mounted to the SCR switching device 11 such that when cooled by the forced air, the bus bar 19 dissipates heat from the SCR switching device 11.

The air guide 17 also divides the cooling air to force air through the fins 14 of the heat sink 12. Namely, the air from the lower portion of the fan 15 is used to cool the heat sink fins 14. In general, the heat sink 12 will offer greater resistance to the flow of air from the lower portion of the fan 15 than to the relatively unobstructed flow of air from the upper portion of the fan. The air guide 17 contains the air from the lower portion of the fan and thus forces cooling air through the heat sink cooling fins 17 to ensure that sufficient cooling air passes.

The power controller 10 also includes a ventilated back plate 20 for exhausting the cooling air that passes over the top of the heat sink 12. The ventilated back plate 20 also may be arranged as a structural member for pinning one or more heat sinks 12 together. That is, in some implementations (e.g., two-leg configuration, three-leg configuration), the ventilated back plate 20 may be secured to the bases 13 of multiple heat sinks 12 using pins inserted through drilled holes, for example. Each side plate 21 (shown in cutaway view) of the power controller 10 may mount to an adjacent side of the heat sink 12, the fan bracket 16, and the ventilated back plate 20 to provide a rigid assembly.

This design minimizes inventory and cost as a single size heat sink 12 may fund applicability in a variety of applications. Namely, one heat sink 12 may be used for single-phase applications, two identical heat sinks 12 may be used for three-phase two-leg applications, and three identical heat sinks 12 may be used for three-phase three-leg applications. Accordingly, the need for large heat sinks or heat sinks of various sizes, which typically have been employed for two and three-leg power controllers, may be eliminated.

Figure 2:
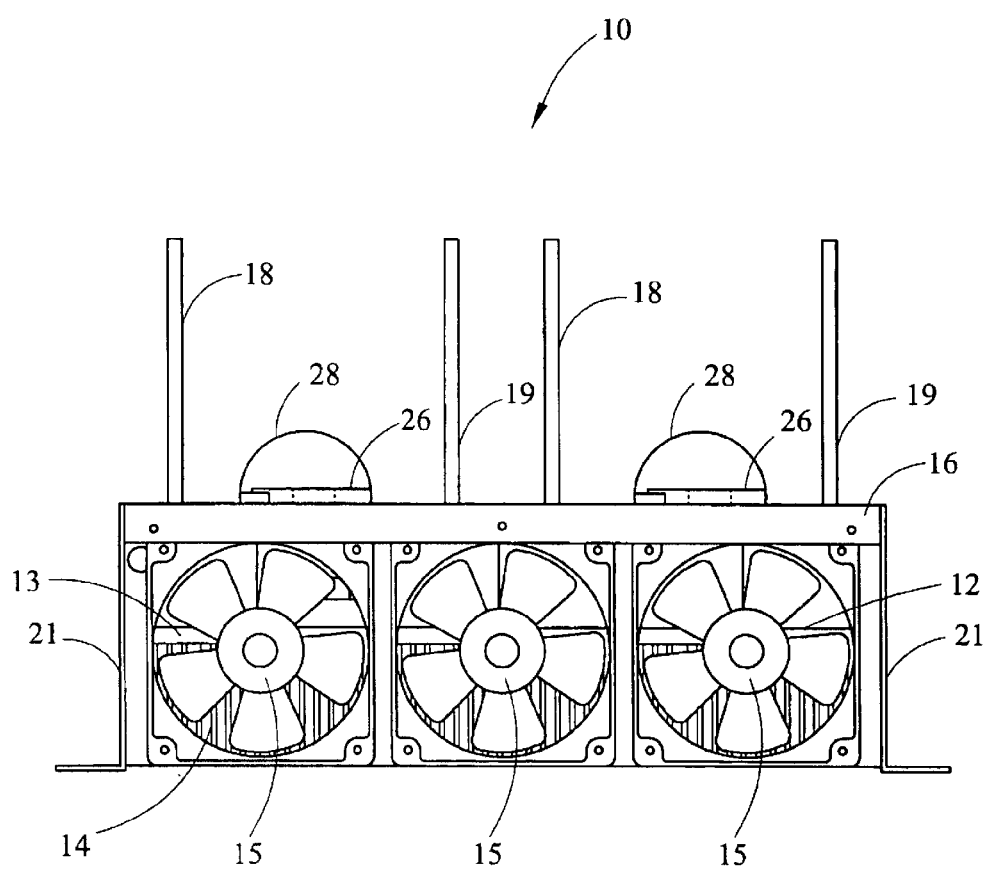
FIGS. 2–4 illustrate aspects of one embodiment of a three-phase two-leg power controller according to the present invention.

Referring to FIG. 2, a front view of one embodiment of a three-phase two-leg power controller 10 is illustrated. As shown, the power controller 10 includes three fans 15 mounted within a fan bracket 16 for supplying cooling air through the power controller 10. In some implementations, the fans 15 may include wire fan guards for providing protection from the blades of the fans 15.

In this embodiment, the power controller 10 includes two identical heat sinks 12 shown behind the fans 15. Each of the heat sinks 12 includes a plurality of fins 14 extending from the base 13 of the heat sink 12. The air from upper portions of the fans 15 may be directed over the top of the heat sinks 12 to cool components mounted on or above the heat sink 12. The air from lower portions of the fans 15 may be directed through the heat sink fins 14.

The power controller 10 also includes two identical bus bars 18 and two identical bus bars 19. Adjacent sides of each of the two heat sinks 12 may be secured together by pins, for example, to provide heat dissipation. In addition, the fan bracket 16 may be used to secure the heat sinks 12 together. The side plates 21 of the power controller 10 may mount to adjacent sides of the heat sinks 12 and the fan bracket 16. In some implementations, a bar or other metal piece, extending from the fan bracket, for example, may be used to tie the heat sinks 12 to each other.

Figure 3:
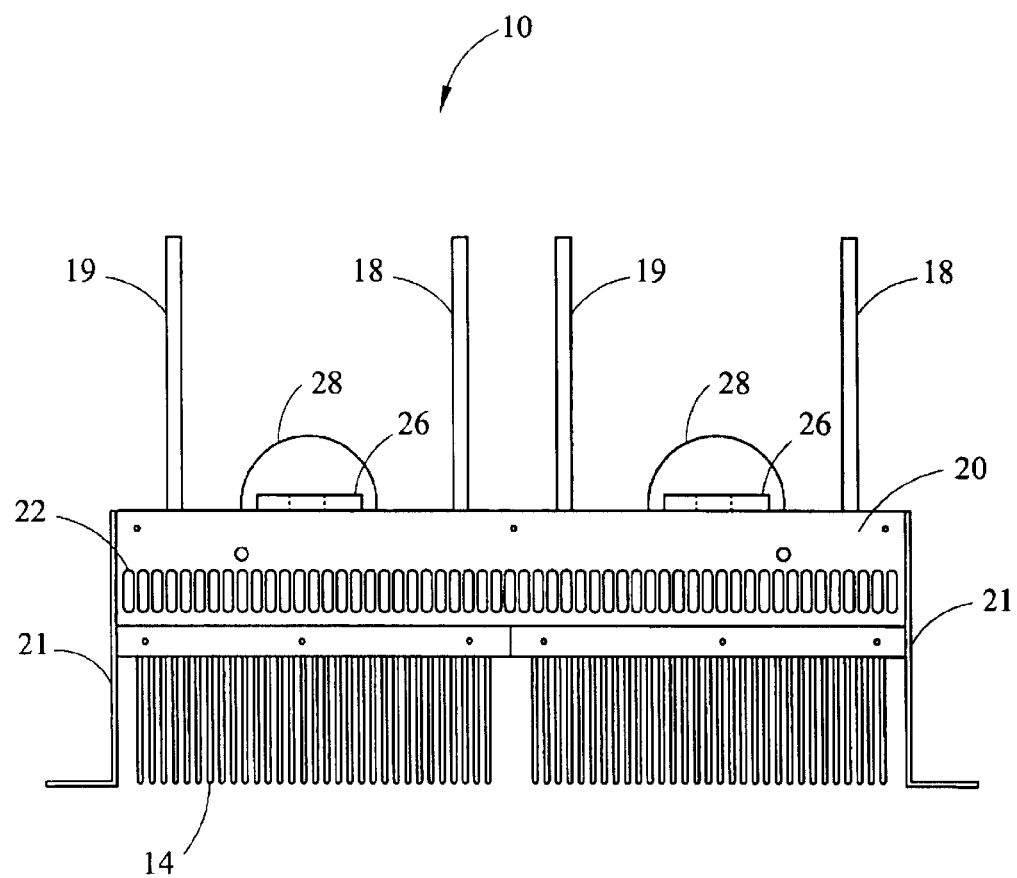

Referring to FIG. 3, a rear view of one embodiment of a three-phase two-leg power controller 10 is illustrated. As shown, the power controller 10 includes two identical heat sinks 12. Each of the heat sinks 12 includes a plurality of fins 14 extending from the base 13 of the heat sink 12. The power controller 10 also includes two identical bus bars 18 and two identical bus bars 19. Adjacent sides of each of the two heat sinks 12 may be secured together by pins, for example, to provide heat dissipation. In addition, the ventilated back plate 20 may be used to secure the heat sinks 12 together. The side plates 21 of the power controller 10 may mount to adjacent sides of the heat sinks 12 and the ventilated back plate 20.

As shown in FIG. 3, the ventilated back plate 20 may include a plurality of exhaust holes 22 for allowing forced air to exit the power controller 10. In this embodiment, for example, air from multiple fans (e.g., fans 15 of FIG. 2) may be directed over the top of the heat sinks 12 to cool components mounted on or above the heat sinks 12 and may be directed through the fins 14 of the heat sinks 12.

Figure 4:
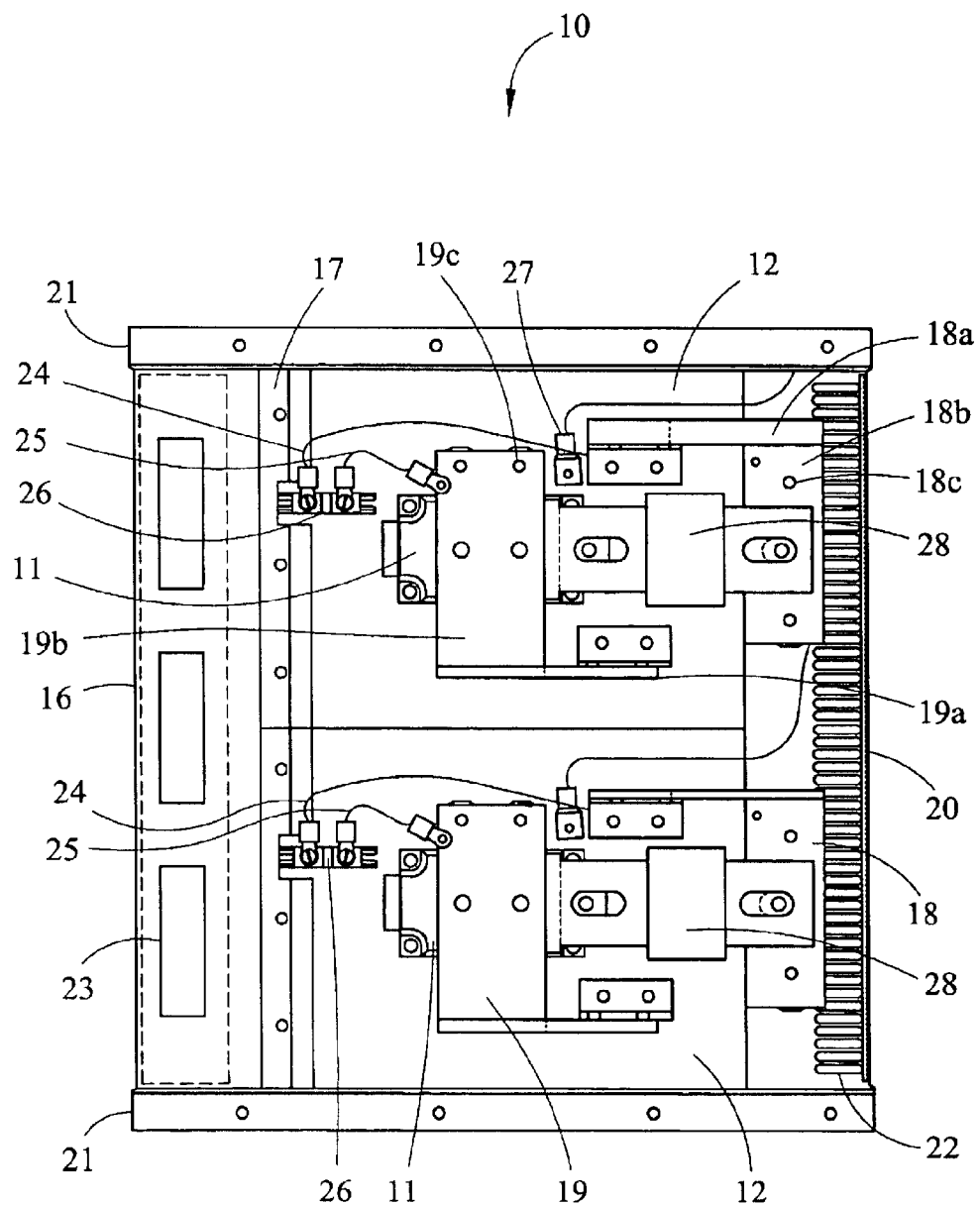

Referring to FIG. 4, a top view of one embodiment of a three-phase two-leg power controller 10 is illustrated. As shown, the power controller 10 includes two identical heat sinks 12, each with identical SCR switching devices 11 and bus bars 18,19. Adjacent sides of each of the two heat sinks 12 may be secured together by pins, for example, to provide heat dissipation for both of the SCR switching devices 11. In addition, the fan bracket 16 and ventilated back plate 20 may be used to secure the heat sinks 12 together. The side plates 21 of the power controller 10 may mount to adjacent sides of the heat sinks 12, the fan bracket 16, and the ventilated back plate 20. In some implementations, a bar or other metal piece, extending from the fan bracket, for example, also may be used to tie the heat sinks 12 to each other.

As shown in FIG. 4, the ventilated back plate 20 may include a plurality of exhaust holes 22 for allowing forced air to exit the power controller 10. In this embodiment, for example, air from multiple fans (e.g., fans 15 of FIG. 2) may be directed over the top of the heat sinks 12 by the air guide 17 to cool the SCR switching devices 11. The openings 23 in the top of the fan bracket 16 are for wiring. The air also may cool other components mounted on or above the heat sink 12 such as, for example, bus bars 18, bus bars 19, and power connectors (not shown). The connectors 24 and connectors 25, respectively, may connect the bus bars 18 and the bus bars 19 to a spike protection element 26 mounted on the heat sink 12.

The power controller 10 also may include a semiconductor temperature sensor 27 mounted to the heat sink 12. In general, the temperature sensor 27 provides improved accuracy (e.g., within ±3° F.) over a traditional thermostat. In one embodiment, the temperature sensor 27 may include a crimp lug for potting the semiconductor sensor and providing a convenient way to monitor the temperature of the heat sink 12. The temperature sensor 27 may be mounted to the heat sink 12 in close proximity to the location where the SCR switching device 11 is mounted.

In one implementation, the temperature sensor 27 may sense the temperature of the heat sink 12 and, in response, interact with circuitry to provide a warning signal (e.g., alarm). The warning signal indicates that the temperature is approaching a condition that will shut down the power controller 10. The warning signal may provide sufficient time for allowing the operator to take corrective actions to prevent an uncontrolled shutdown and/or for allowing the operator to perform an orderly shutdown.

In other applications, for example, in two-leg or three-leg applications having multiple identical heat sinks 12, a temperature sensor 27 may be used on each heat sink 12. In such cases, each one of the temperature sensors 27 detects the temperature of a corresponding heat sink 12 and may trigger the warning signal and/or shutdown if necessary. While the temperature sensor 27 may provide advanced warning of an approaching dangerous condition, there still may be times when an immediate shut down is warranted. Accordingly, the power controller 10 also may be equipped with an emergency shut down contact for interrupting power output. In some cases, the emergency shut down may be initiated from a location remote from the power controller 10.

In addition to those described above, the power controller 10 may employ further protective features. For example, a fuse 28 may be connected between an associated SCR device 11 and a bus bar 18. The fuse 28 may be configured to protect the SCR device 11, for example, by interrupting the power flow if the equipment begins drawing excessive current. In some implementations, the fuse 28 may include $I^2t$ fusing for providing over-current protection. In general, the SCR device 11 may have a low transient thermal capacity and may be quickly damaged by high fault currents. A fuse 28 configured with $I^2t$ fusing is ultra current limiting and well suited to protect against such faults. Because a fuse 28 including $I^2t$ fusing typically may not be designed to protect the load, however, sub-circuit fusing specifically designed for load protection may be included. For example, sub-circuit fusing with a blown fuse indication may be included.

The power controller 10 also may include shorted SCR detection designed to identify when a SCR switching device 11 has failed in the shorted mode. In some implementations, a "plug and play" card may be incorporated into the firing package of the power controller 10 to provide shorted SCR detection functionality. A light emitting diode (LED) and contact closure, for example, may be used to signal this condition.

Referring now to FIGS. 1–4, the power controller 10 is designed to provide convenience in installation and wiring by eliminating the need for separate power distribution blocks and by reducing labor and the required amounts of power wiring and connections. The design of the power controller 10 allows power wiring and load wiring to enter and exit from either end of power controller 10. This feature can greatly simplify the design of the panel layout in the enclosure and may result in a smaller enclosure being used.

As described above, the power controller 10 may be used in industrial applications as an interface between a power generating facility and electrical equipment. In such implementations, the power controller 10 receives power supplied from the power generating facility and regulates the distribution of power to load circuits of the electrical equipment. In general, power wiring may be used to make the necessary electrical connections between components of the power generating facility and components of the power controller 10 as well as to make electrical connections among components of the power controller 10. Load wiring may be used to make the necessary electrical connection between components of the power controller 10 and one or more load circuits in order to distribute power.

As shown in FIGS. 1–4, the bus bars 18,19 include face plates 18a, 19a and mounting plates 18b, 19b. The face plates 18a, 19a and mounting plates 18b, 19b each include a plurality of holes 18c, 19c for attaching wiring terminals or other components to the bus bars 18,19 and/or for mounting the bus bars 18,19 within the power controller 10. In some implementations, power wiring and/or load wiring may be threaded through the holes 18c, 19c and attached to various components within the power controller 10.

In general, the bus bars 18,19 are mounted within the power controller 10 such that wiring may enter and/or exit from either end of the power controller 10. For example, the face plates 18a, 19a may be mounted parallel to and at least partially above the side plates 21 of the power controller 10 so that wiring attached to the bus bars 18,19 may enter and/or exit the power controller 10 from either end. In some implementations, the bus bars 18,19 may be mounted at right angles (not shown) such that wiring may enter and/or exit either side of the power controller 10. Accordingly, power wiring and/or load wiring may enter and/or exit from either end and/or either side of the power controller 10. Furthermore multiple load circuits may be connected to the power controller 10 from either end and/or either side of the power controller 10.

In some implementations, for example, NEMA standard two hole copper crimp lugs may be used in securing lugs to the bus bars 18,19 and in securing wire in a crimp lugs. While other materials may be used, NEMA standard two hole copper crimp lugs provide superior connections while providing space not possible with compression type lugs that accept various size wires. Additionally, in some implementations an insulator may be provided between bus bars 18,19 that is held in place by the bus bars 18,19 and SCR switching devices 11 requiring no screws or other hardware.

The design of the power controller 10 also allows power distribution to be provided directly from the bus bars 18,19. For example, a power connection lug may be mounted to the bus bar 18 and/or the bus bar 19 for distributing power. This feature eliminates the need for separate power distribution blocks and associated wiring and connections and may save two or three times the space of the power controller itself. Furthermore, by minimizing the number of components and connections, the cost is reduced and reliability is increased for the power controller 10.

Figure 5A:
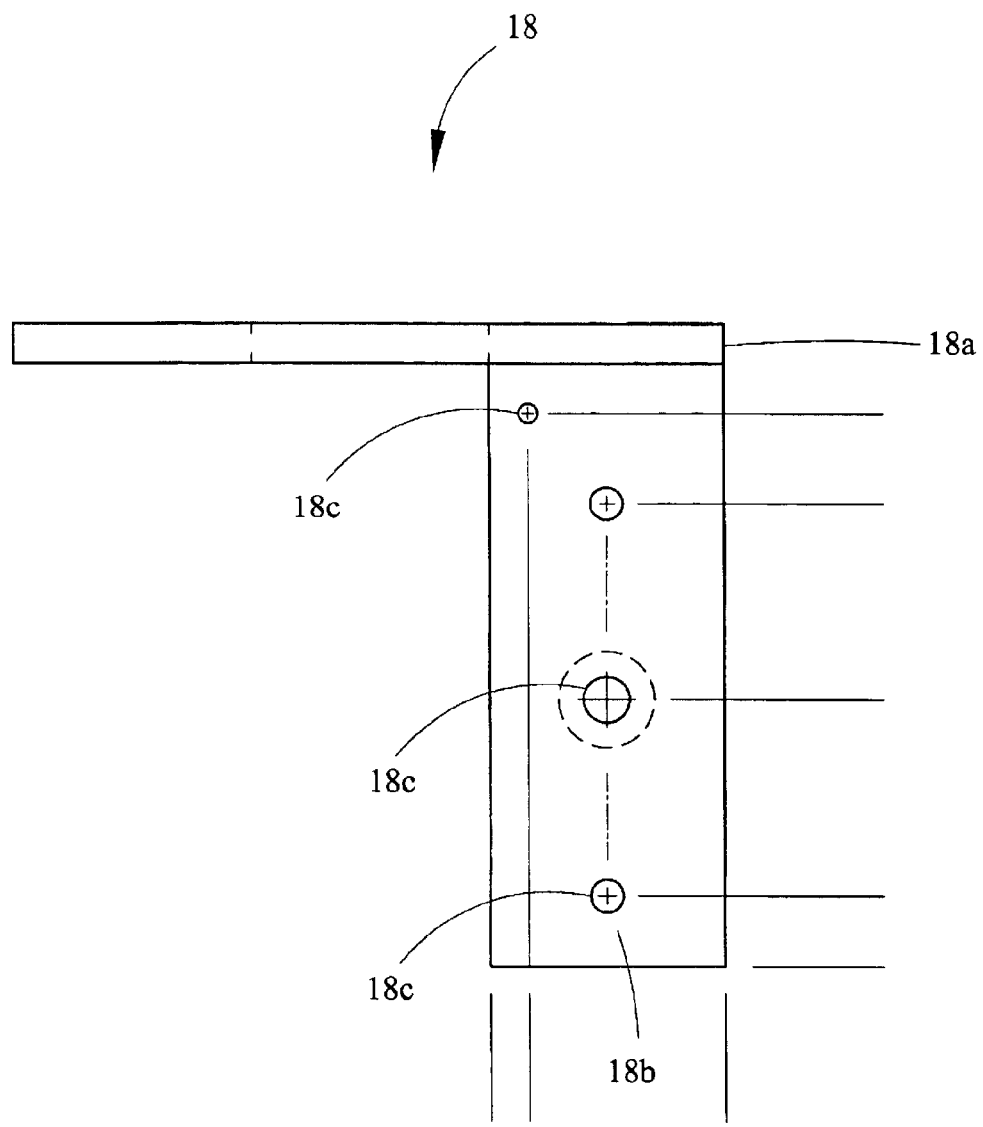
FIGS. 5A and 5B illustrate aspects of one embodiment of a bus bar according to the present invention.
Figure 5B:
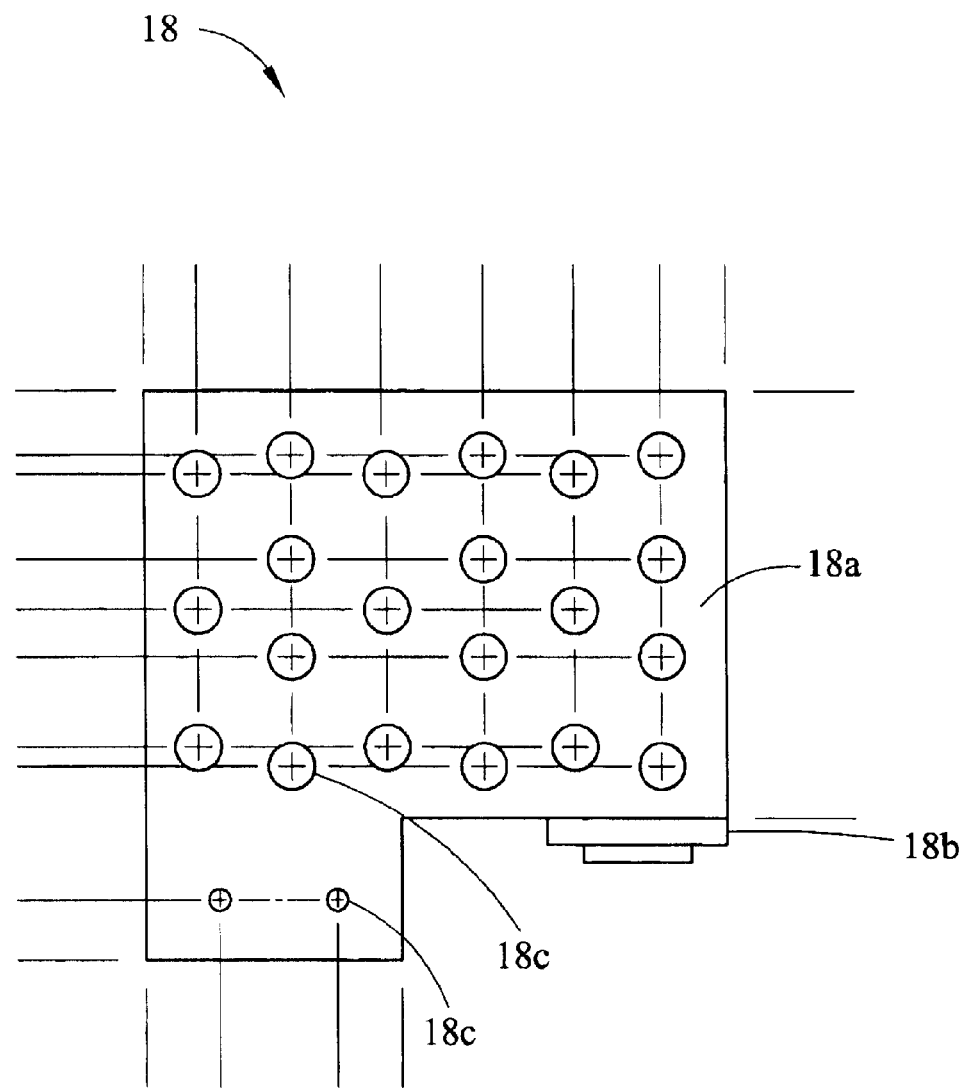
Figure 6A:
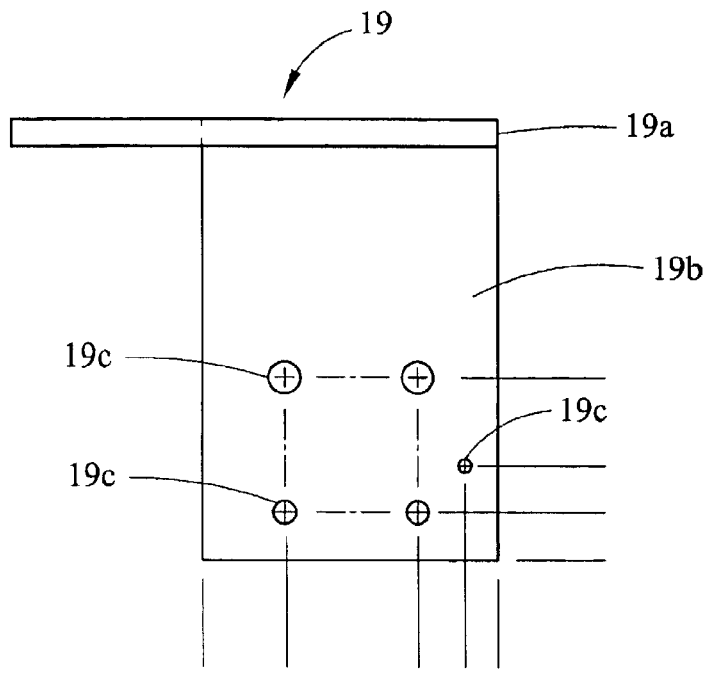
FIGS. 6A and 6B illustrate aspects of one embodiment of a bus bar according to the present invention.
Figure 6B:
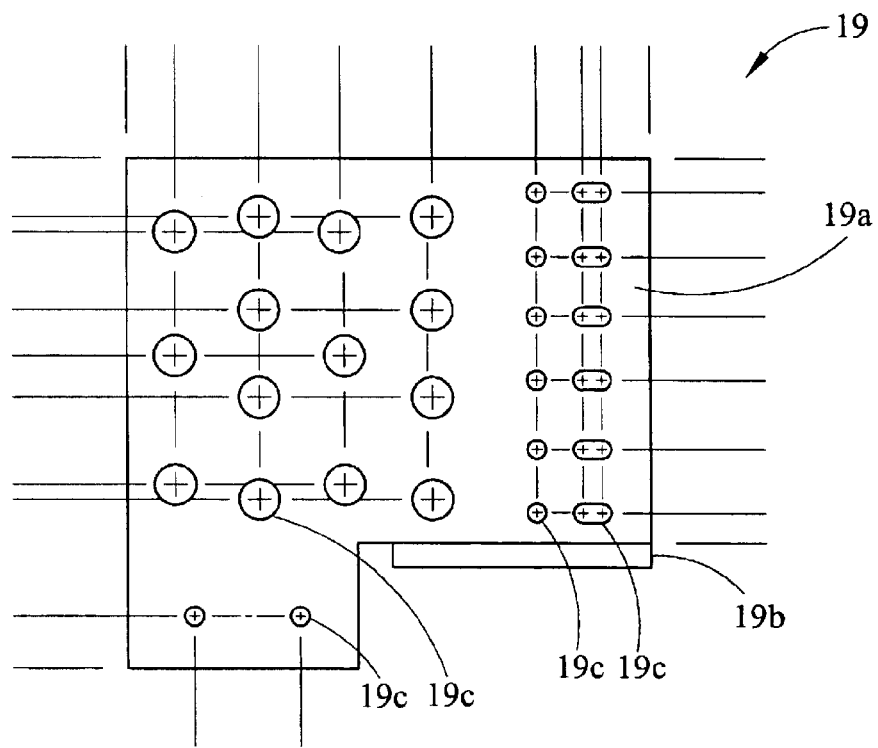

FIGS. 5A and 5B illustrate one embodiment of bus bar 18 and FIGS. 6A and 6B illustrated one embodiment of bus bar 19. In most implementations, the bus bars 18,19 may be constructed of plated copper, for example, tin-plated copper. While other materials may be used, tin-plated copper exhibits less corrosion and heat build-up than materials such as plain copper or aluminum.

As shown, each of the bus bars 18,19 respectively includes a face plate 18a,19a a mounting plate 18b,19b, and a plurality of holes 18c,19c for mounting, connecting, and/or routing purposes. In one implementation, the bus bars 18,19 are structured to be used with multiple connectors of various sizes, for example, ranging from #8 AWG to 500 MCM. The bus bars 18,19 may allow entry or exit of such connectors from either end when mounted within a power controller. In addition, the bus bars 18,19 may be designed to provide direct power distribution, thus eliminating the need for separate power distribution blocks and associated wiring and connections.

Figure 7:
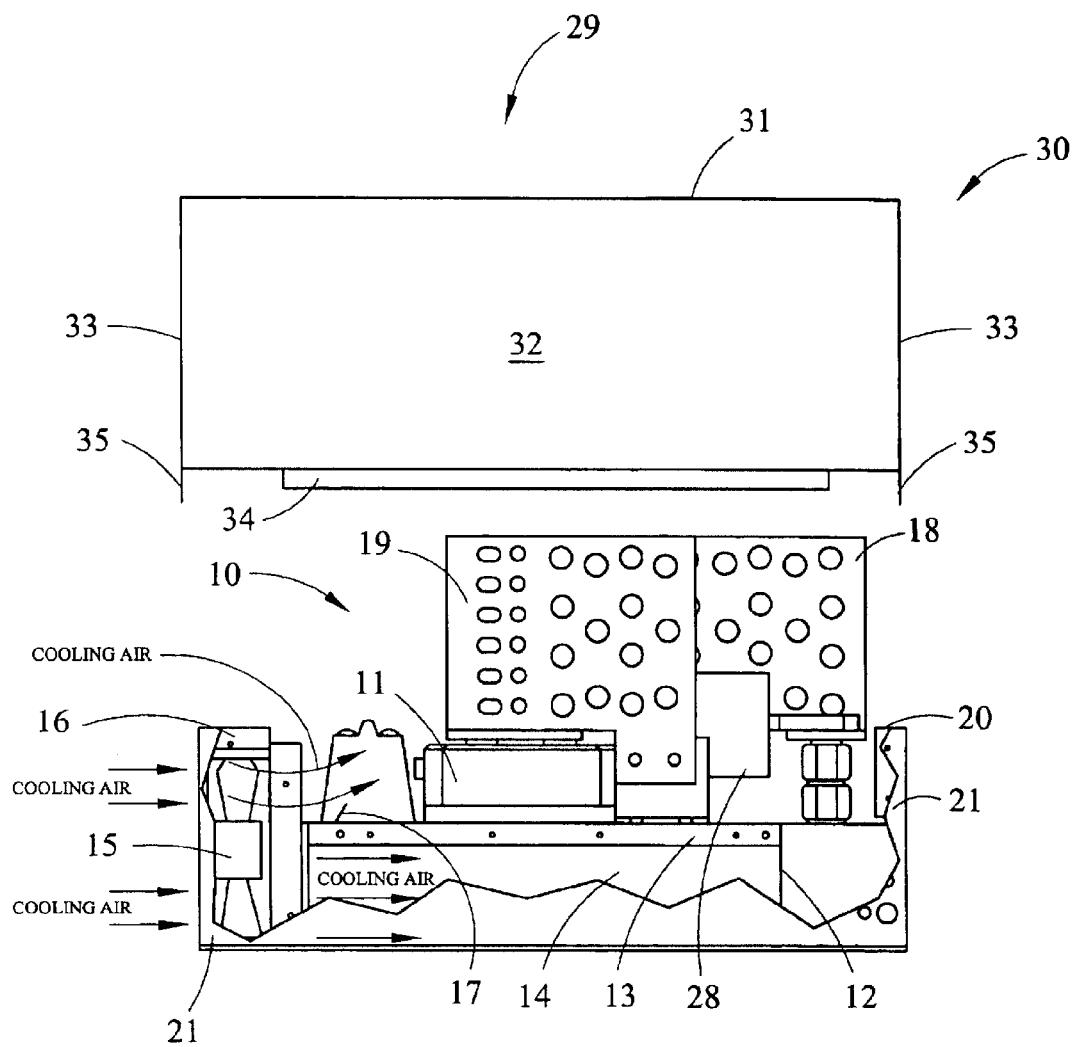
FIG. 7 illustrates aspects of one embodiment of a power controller assembly according to the present invention.

Referring to FIG. 7, a power controller assembly 29 may be constructed by attaching a removable cover 30 to the power controller 10. The power controller assembly 29 is designed to be "touch safe"—that is, the cover 30 provides protection from components of the power controller 10 that become electrically hot during use.

In general, the cover 30 has a top surface 31, opposed side surfaces 32, and opposed end surfaces 33. As shown, the side surfaces 32 each include partial sides 34 for accommodating and engaging the fan bracket 16, the back plate 20, and the side plate 21 of the power controller 10 when the cover 30 is attached. The side surfaces 32 also may include locking members 35 for engaging the power controller 10. When the cover 30 is removed from the power controller 10, unobstructed access is provided to the bus bars 18,19 such that wires can enter and exit either direction of the power controller 10 and power distribution may be provided directly from the bus bars 18,19.

Figure 8A:
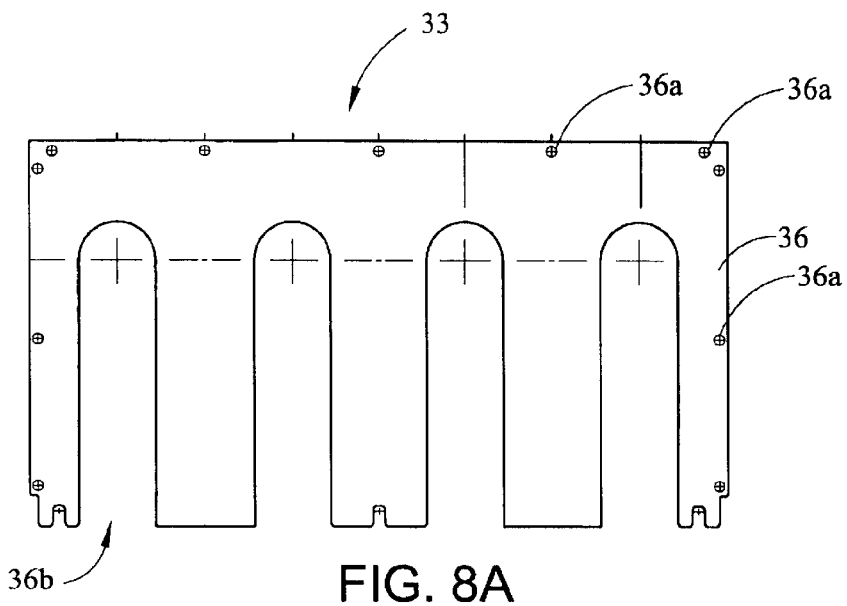
FIGS. 8A–8C illustrate aspects of one embodiment of a cover according to aspects of the present invention.
Figure 8B:
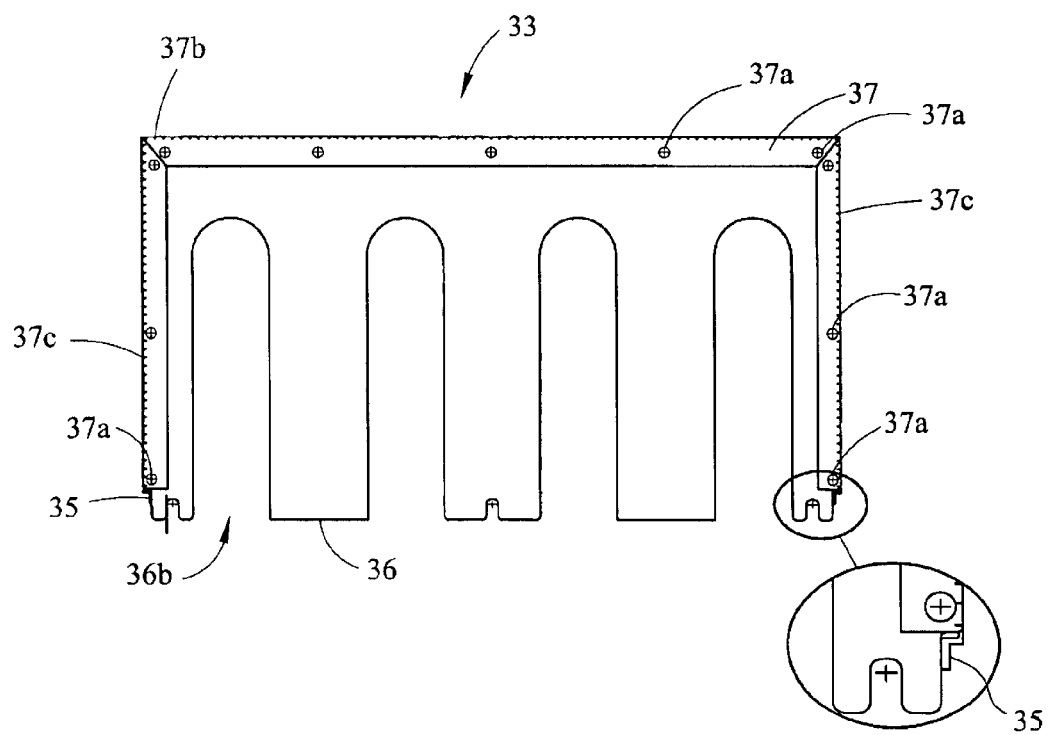
Figure 8C:
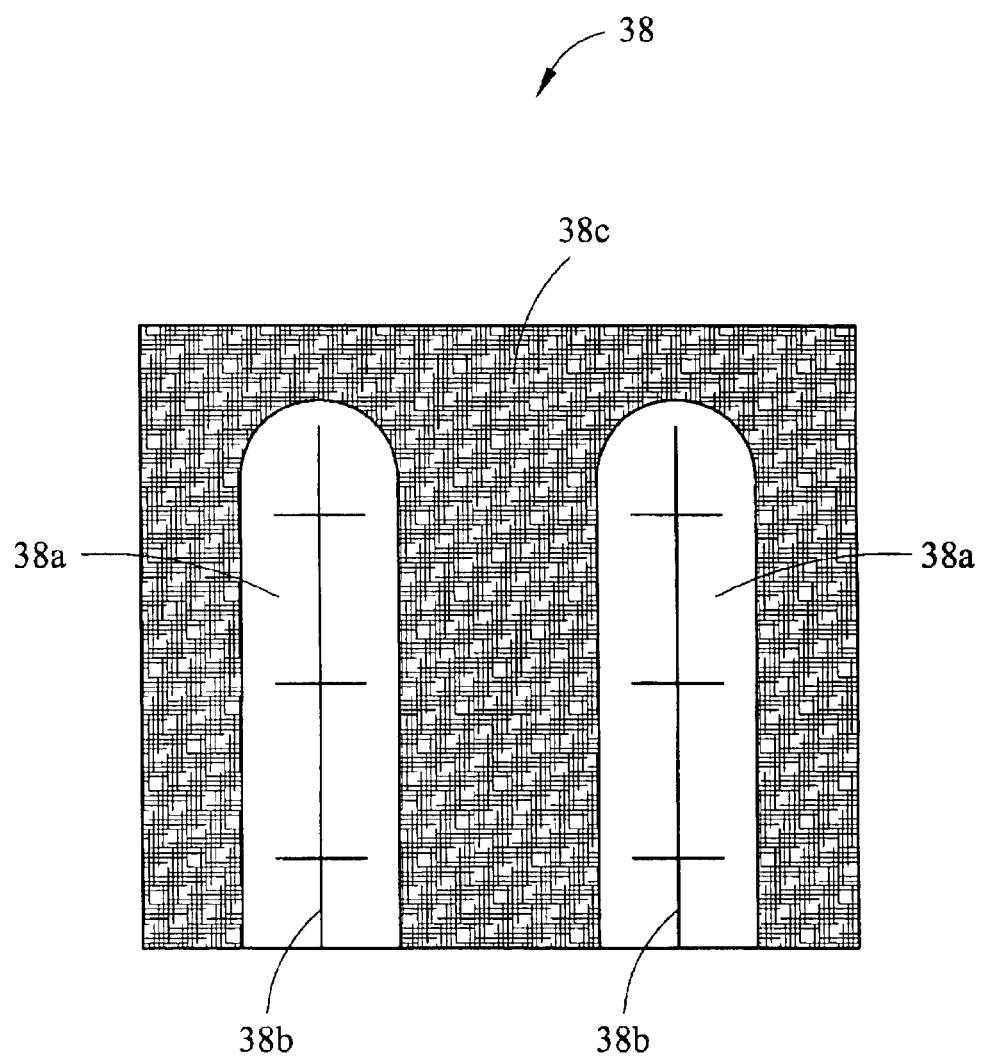

FIGS. 8A–8C illustrate elements of one embodiment of an end surface 33 of the cover 30. As shown, the end surface 33 may be constructed from an end plate 36, an outer shell 37, and an insulator 38. In this embodiment, the end plate 36 is secured to the outer shell 37 by inserting pins into corresponding mounting holes 36a, 37a. In some implementations, corresponding surfaces 37b,37c of the outer shell 37 may be integral with the top surface 31 and side surfaces 32 of the cover 30. As shown in FIG. 8B, for example, the side surfaces 37c of the outer shell 37 may include the locking members 35.

The end plate 36 may include one or more windows 36b for allowing wires to pass through the ends of the cover 30 and attach to components of a power controller (e.g., bus bars 18,19). For example, power line wiring and/or load wiring may align with the windows 36b and enter or exit either end of the power controller 10. In some implementations, the number of windows 36b may be twice that which is normally used in a particular application, owing to the option of running wires in either direction.

Referring to FIG. 8C, an insulator 38 may be used for covering the windows 36b of the end plate 36. In some implementations, the insulator 38 may include a gasket material 38a such as, for example, styrene butadiene rubber (SBR) to seal the windows 36b. The insulator 38 includes slits 38b cut to allow wires to pass. The slits 38b may be held together with tape (not shown) on the back of the insulator 38. When the tape is removed, wiring may pass into the windows 36b through the slits 38b in the insulator 38. Unused windows 36b remain taped to maintain the "touch safe" feature. The insulator 38 also may include an adhesive 38c for adhering to the back of the end plate 36.

Figure 9A:
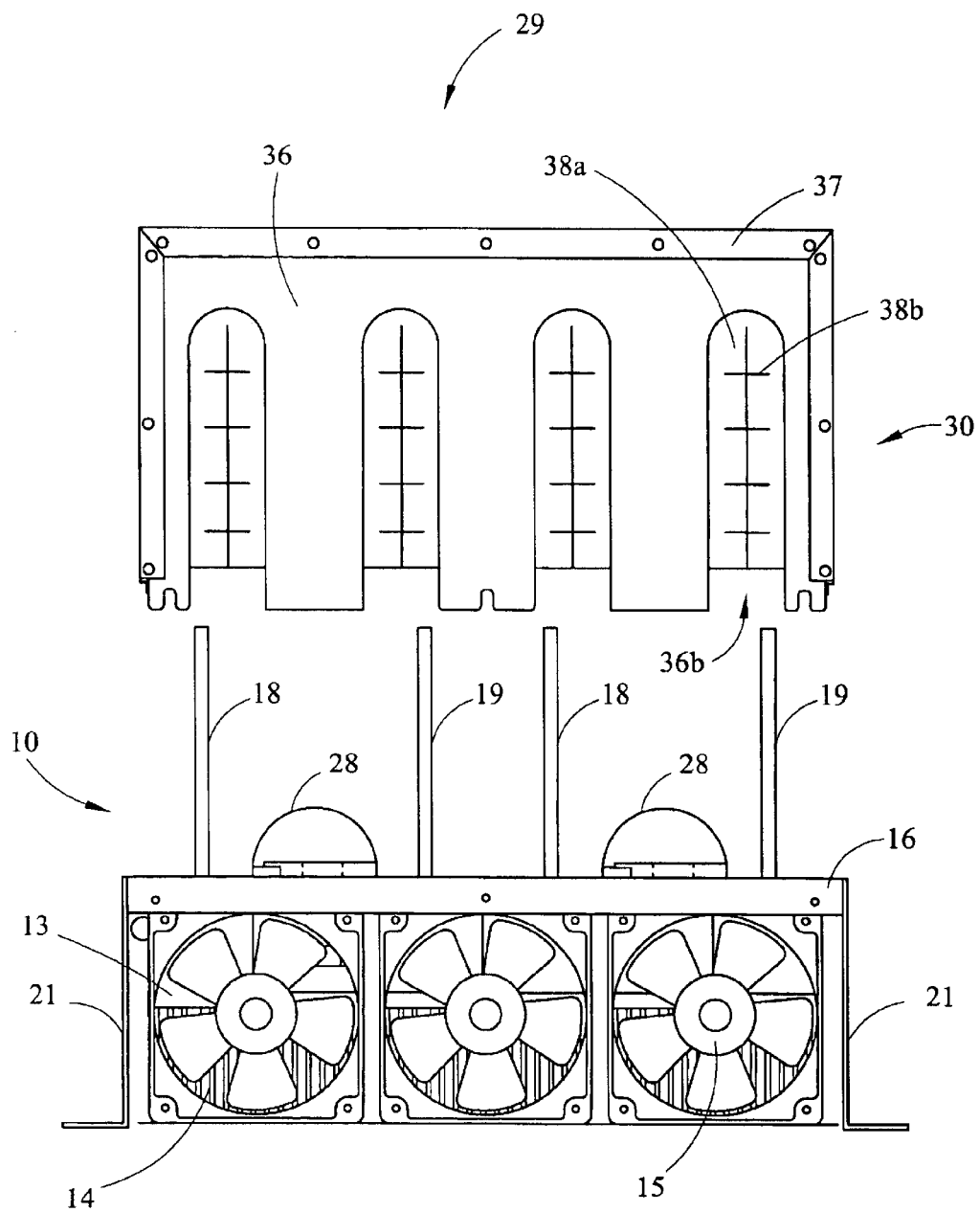
FIGS. 9A and 9B illustrate aspects of one embodiment of a power controller assembly according to the present invention.
Figure 9B:
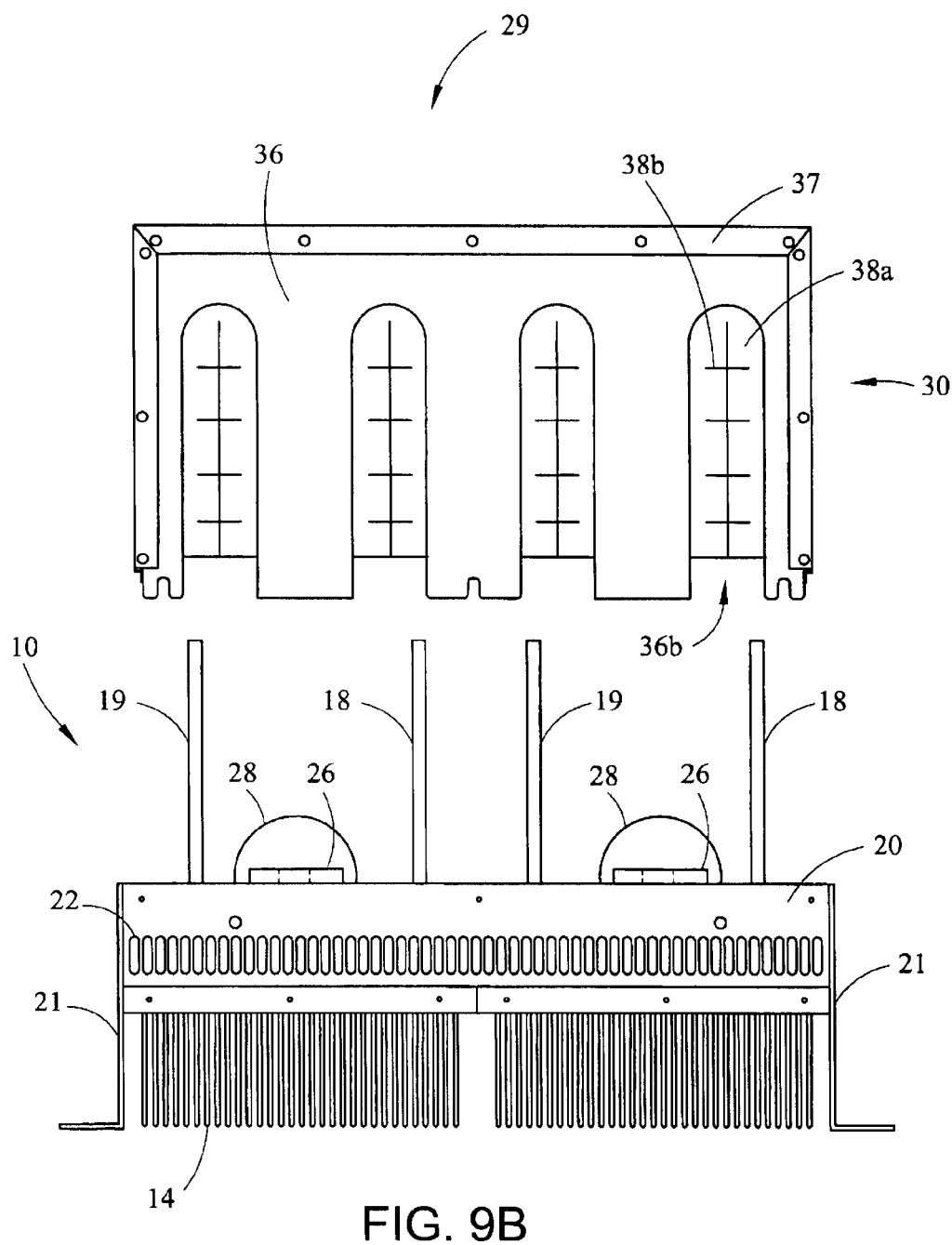

FIGS. 9A and 9B illustrate a power controller assembly 29 constructed by attaching the removable cover 30 to the power controller 10. As shown, when the cover 30 is removed from the power controller 10, unobstructed access is provided to the bus bars 18,19 such that wires can enter and exit either direction of the power controller 10 and power distribution may be provided directly from the bus bars 18,19. It can also be seen that the location of the fuses 28 are such that they can be readily removed without disturbing the wiring.

The windows 36*b* may be designed to align exactly with the largest wires accommodated (e.g., 500 MCM). Smaller wires may be slightly offset in the window 36*b* or may be bent slightly to align exactly in the center. In this embodiment, the cover 30 includes eight windows 36*b* for providing the option of running power wiring and/or load wiring from either end. In some cases, only half of the windows 36*b* are used while the others remain sealed by tape on the back of the gasket material 38*a*.

In general, the design of the power controller 10 is compact and readily assembled and results in a smaller footprint per amp, especially on touch safe designs. Accordingly, the size of the power controller 10 may be substantially reduced, while still offering the highest level of performance and functionality.

A number of implementations have been described. Nevertheless, it will be understood that various modifications may be made and that other implementations are within the scope of the following claims.

What is claimed is:

1. A power controller comprising:
   a first switching device; and
   a first bus bar mounted to the first switching device such that wiring may enter and exit the power controller, the first bus bar having a face plate extending at least partially above opposed side plates of the power controller and a mounting plate in electrical contact with the first switching device.

2. The power controller of claim 1, wherein the wiring may enter and exit ends of the power controller in a direction substantially parallel to the opposed side plates.

3. The power controller of claim 1, wherein the wiring may enter and exit sides of the power controller in a direction substantially perpendicular to the opposes side plates.

4. The power controller of claim 1, wherein the wiring comprises at least one of power wiring and load wiring.

5. The power controller of claim 1, wherein the power controller is configured to provide power distribution directly from the first bus bar.

6. The power controller of claim 1, wherein the first bus bar comprises a plated copper material.

7. The power controller of claim 6, wherein the plated copper material comprises tin-plated copper.

8. The power controller of claim 1, wherein the face plate of the first bus bar comprises a plurality of holes.

9. The power controller of claim 8, wherein the plurality of holes comprises holes of different sizes for accommodating connectors of different sizes.

10. The power controller of claim 10, further comprising one or more lugs mounted to the first bus bar.

11. The power controller of claim 10, wherein at least one lug comprises a two hole copper crimp lug.

12. The power controller of claim 10, wherein at least one lug comprises a power distribution lug.

13. The power controller of claim 1, wherein the first bus bar is electrically connected to one or more load circuits.

14. The power controller of claim 1, wherein the power controller is configured to supply at least one of single-phase power or three-phase power to using equipment.

15. The power controller of claim 1, further comprising a firing package for controlling the first switching device.

16. The power controller of claim 15, wherein the firing package comprises one or more plug and play cards.

17. The power controller of claim 16, further comprising a plug and play card for providing proportional control.

18. The power controller of claim 16, further comprising a plug and play card for shorted SCR detection.

19. The power controller of claim 15, wherein the firing package comprises a jumper module for selecting between single-cycle control and three-cycle control.

20. The power controller of claim 15, wherein the firing package comprises a trigger board mounted on the switching device.

21. The power controller of claim 20, wherein the trigger board contains a line voltage for triggering the first switching device.

22. The power controller of claim 20, wherein the trigger board is configured for use with different sizes of switching devices.

23. The power controller of claim 20, wherein the trigger board comprises one or more break-off tabs.

24. The power controller of claim 1, wherein the power controller is structured and arranged in at least one of single-phase configuration, a three-phase two-leg configuration, and a three-phase three-leg configuration.

25. The power controller of claim 1, further comprising a second bus bar mounted such that wiring may enter and exit the power controller, the second bus bar having a face plate extending at least partially above the opposed side plates of the power controller.

26. The power controller of claim 25, wherein the power controller is configured to provide power distribution directly from at least one the first bus bar and the second bus bar.

27. The power controller of claim 25, further comprising an insulator between the first and second bus bars that is held in place by the bus bars and the switching device.

28. The power controller of claim 25, further comprising:
    a second switching device;
    a third bus bar mounted to the second switching device such that wiring may enter and exit the power controller, the third bus bar having a face plate extending at least partially above opposed side plates of the power controller and a mounting plate in electrical contact with the second switching device.

29. The power controller of claim 28, wherein the power controller is configured to provide power distribution directly from at least one the first bus bar, the second bus bar, and the third bus bar.

30. The power controller of claim 28, further comprising a fourth bus bar mounted such that wiring may enter and exit the power controller, the fourth bus bar having a face plate extending at least partially above the opposed side plates of the power controller.

* * * * *

UNITED STATES PATENT AND TRADEMARK OFFICE
CERTIFICATE OF CORRECTION

| | | |
|---|---|---|
| PATENT NO. | : 6,826,035 B2 | |
| APPLICATION NO. | : 10/255742 | |
| DATED | : November 30, 2004 | |
| INVENTOR(S) | : Roman et al. | |

It is certified that error appears in the above-identified patent and that said Letters Patent is hereby corrected as shown below:

Column 1, line 12, delete "arc" and replace therewith --are--.

Column 5, line 20, delete "includes" and replace therewith --include--.

Column 5, line 53, delete "spaceport" and replace therewith --spaced-apart--.

Column 6, line 47, delete "cutaway" and replace therewith --cut-away--.

Column 6, line 52, delete "fund" and replace therewith --find--.

Column 7, line 16, delete "tic" and replace therewith --tie--.

Column 8, line 2, delete "F." and replace therewith --F--.

Column 9, line 59, delete "illustrated" and replace therewith --illustrate--.

Column 9, line 66, delete "19$a$" and replace therewith --19$a$,--.

Signed and Sealed this

Tenth Day of April, 2007

JON W. DUDAS
*Director of the United States Patent and Trademark Office*